US010403856B2

(12) United States Patent
Aoki

(10) Patent No.: US 10,403,856 B2
(45) Date of Patent: Sep. 3, 2019

(54) ORGANIC EL PANEL HAVING SUBSTRATE COMPRISING LIGHT INCIDENT SECTION AND LIGHT GUIDE SECTION

(71) Applicant: NEC Lighting, LTD., Tokyo (JP)

(72) Inventor: Yasushi Aoki, Tokyo (JP)

(73) Assignee: NEC LIGHTING, LTD., Minato-Ku, Tokyo (JP)

( * ) Notice: Subject to any disclaimer, the term of this patent is extended or adjusted under 35 U.S.C. 154(b) by 0 days.

(21) Appl. No.: 15/575,990

(22) PCT Filed: May 9, 2016

(86) PCT No.: PCT/JP2016/063778
§ 371 (c)(1),
(2) Date: Nov. 21, 2017

(87) PCT Pub. No.: WO2016/190073
PCT Pub. Date: Dec. 1, 2016

(65) Prior Publication Data
US 2018/0151844 A1    May 31, 2018

(30) Foreign Application Priority Data
May 25, 2015 (JP) ................... 2015-105785

(51) Int. Cl.
*H01L 51/50* (2006.01)
*H01L 51/52* (2006.01)
(Continued)

(52) U.S. Cl.
CPC ...... *H01L 51/5281* (2013.01); *H01L 51/0096* (2013.01); *H01L 51/5246* (2013.01);
(Continued)

(58) Field of Classification Search
CPC . H01L 51/50; H01L 51/5246; H01L 51/5281; H01L 27/14; H01L 31/00;
(Continued)

(56) References Cited

U.S. PATENT DOCUMENTS

| 2001/0021107 | A1 | 9/2001  | Funamoto et al. |
|---|---|---|---|
| 2004/0052066 | A1 | 3/2004  | Funamoto et al. |
| 2004/0119407 | A1 | 6/2004  | Kim et al. |
| 2005/0169012 | A1 | 8/2005  | Takeuchi |
| 2006/0268438 | A1 | 11/2006 | Lee et al. |
| 2011/0170290 | A1 | 7/2011  | Hikmet et al. |

FOREIGN PATENT DOCUMENTS

| EP | 1391945 A2   | 2/2004 |
|---|---|---|
| EP | 1533632 A1   | 5/2005 |
| EP | 1726976 A1   | 11/2006 |
| JP | H0244392 A   | 2/1990 |
| JP | 2001-143865 A | 5/2001 |

(Continued)

OTHER PUBLICATIONS

International Search Report corresponding to PCT/JP2016/063778 dated Aug. 2, 2016 (2 pages).

*Primary Examiner* — Hoai V Pham
(74) *Attorney, Agent, or Firm* — Sughrue Mion, PLLC

(57) ABSTRACT

The present invention provides a novel organic EL panel adapted to be color tunable by a user, for example. An organic EL panel 10 of the present invention includes: a first substrate 11; a second substrate 12; an organic EL element 13; and a sealing layer 14. One surface of the first substrate 11 is a mounting surface on which the organic EL element 13 is disposed. The first substrate 11 and the second substrate 12 are laminated in such a manner that the mounting surface of the first substrate 11 and one surface of the second substrate 12 face each other with the sealing layer 14 interposed therebetween. The sealing layer 14 seals a gap between the first substrate 11 and the second substrate 12

(Continued)

along an entire periphery of a region where the first substrate 11 and the second substrate 12 face each other. The first substrate 11 includes a light incident section 15 on which laser light is incident and a light guide section 16 that directs the incident laser light in an in-plane direction.

11 Claims, 3 Drawing Sheets

(51) Int. Cl.
| | | |
|---|---|---|
| *H01L 51/00* | (2006.01) | |
| *F21V 8/00* | (2006.01) | |
| *F21Y 101/00* | (2016.01) | |
| *F21Y 115/15* | (2016.01) | |
| *F21Y 113/10* | (2016.01) | |
| *F21Y 113/20* | (2016.01) | |

(52) U.S. Cl.
CPC ...... *H01L 51/5262* (2013.01); *F21Y 2101/00* (2013.01); *F21Y 2113/10* (2016.08); *F21Y 2113/20* (2016.08); *F21Y 2115/15* (2016.08); *G02B 6/0068* (2013.01); *G02B 6/0075* (2013.01); *G02B 6/0076* (2013.01); *G02B 6/0088* (2013.01); *Y02E 10/549* (2013.01)

(58) Field of Classification Search
CPC ...... G02B 6/00; G02B 6/0068; G02B 6/0075; G02B 6/42
See application file for complete search history.

(56) References Cited

FOREIGN PATENT DOCUMENTS

| | | |
|---|---|---|
| JP | 2001-313163 A | 11/2001 |
| JP | 2002-100229 A | 4/2002 |
| JP | 2003-092002 A | 3/2003 |
| JP | 2004-055565 A | 2/2004 |
| JP | 2005-158370 A | 6/2005 |
| JP | 2005-317354 A | 11/2005 |
| JP | 2006-330672 A | 12/2006 |
| JP | 2007-226973 A | 9/2007 |
| JP | 2012-503274 A | 2/2012 |
| JP | 2015-011884 A | 1/2015 |
| JP | 2015-200833 A | 11/2015 |

ORGANIC EL PANEL HAVING SUBSTRATE COMPRISING LIGHT INCIDENT SECTION AND LIGHT GUIDE SECTION

CROSS-REFERENCE TO RELATED APPLICATIONS

This application is a national stage application of International Application No. PCT/JP2016/063778 entitled "Organic EL Panel"filed on May 9, 2016, which claims priority to Japanese Patent Application No. 2015-105785 filed on May 25, 2015, the disclosures of which are hereby incorporated by reference in their entirety.

TECHNICAL FIELD

The present invention relates to an organic EL panel.

BACKGROUND ART

An organic electro-luminescence (EL) panel is a self-emitting panel provided with an organic EL element (organic EL layer), and can be used as a lighting device, a light source, or a display device, for example. The emission color of the organic EL panel is determined by the material of the organic EL layer (light emission layer). Thus, when the organic EL panel is in practical use, the emission color is fixed already. On this account, it is generally impossible for a user to adjust the emission color (to perform color tuning) of the organic EL panel.

Under these circumstances, there has been proposed an organic EL panel configured so that organic EL layers for red, green, and blue (RGB) are formed separately, and color adjustment is achieved by adjusting the balance among the emission intensities of RGB (Patent Document 1).

CITATION LIST

Patent Document(s)

Patent Document 1: JP H2(1990)-44392 A

BRIEF SUMMARY OF THE INVENTION

Problem to be Solved by the Invention

However, in the organic EL panel with the above-described RGB separation structure, it is necessary to provide the RGB light emission layers separately. The aperture ratio is thus restricted, so that it is difficult to increase the amount of luminous flux emitted from the light emission surface of the organic EL panel. One possible method for increasing the amount of luminous flux is to increase the driving current. This, however, shortens the life of the organic EL panel.

With the foregoing in mind, it is an object of the present invention to provide a novel organic EL panel adapted to be color tunable by a user, for example.

Means for Solving Problem

In order to achieve the above object, the present invention provides an organic EL panel including: a first substrate; a second substrate; at least one organic EL element; and a sealing layer, wherein one surface of the first substrate is a mounting surface on which the at least one organic EL element is disposed, the first substrate and the second substrate are laminated in such a manner that the mounting surface of the first substrate and one surface of the second substrate face each other with the sealing layer interposed therebetween, the sealing layer seals a gap between the first substrate and the second substrate along an entire periphery of a region where the first substrate and the second substrate face each other, and at least one of the first substrate and the second substrate includes at least one light incident section on which laser light is incident and at least one light guide section that directs the incident laser light in an in-plane direction.

Effects of the Invention

The present invention can provide a novel organic EL panel adapted to be color tunable by a user, for example.

MODE FOR CARRYING OUT THE INVENTION

Figure 1A:
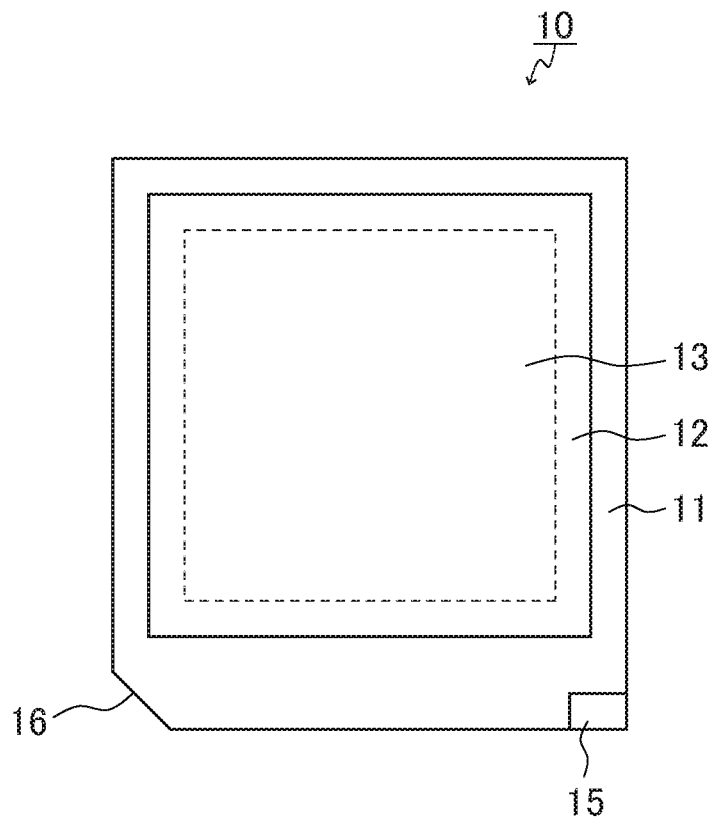
FIG. 1A is a plan view showing an example of the configuration of an organic EL panel according to a first embodiment.

The organic EL panel of the present invention will be described specifically below with reference to the accompanying drawings. It is to be noted, however, that the present invention is by no means limited by the following description. In FIGS. 1 to 4 to be described below, the same components are given the same reference numerals, and duplicate explanations thereof may be omitted. Also, in the drawings, the structure of each component may be shown in an simplified form as appropriate for the sake of convenience in illustration, and also, each component may be shown schematically with a dimension ratio and the like that are different from the actual dimension ratio and the like.

[First Embodiment]

Figure 1B:
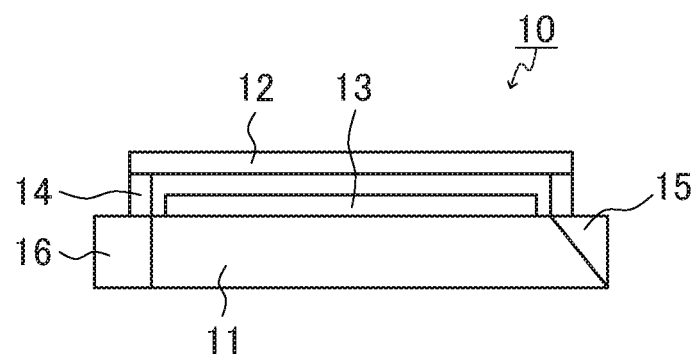
FIG. 1B is a side view of the organic EL panel shown in FIG. 1A, as viewed from the side of a side surface connecting the light incident section and the light guide section.

The present embodiment is directed to an example of an organic EL panel configured so that a first substrate has one light incident section and one light guide section. FIGS. 1A and 1B show an organic EL panel of the present embodiment. FIG. 1A is a plan view showing an example of the configuration of an organic EL panel of the present embodiment. FIG. 1B is a side view of the organic EL panel shown in FIG. 1A, as viewed from the side of a side surface connecting a light incident section and a light guide section. As shown in FIGS. 1A and 1B, the organic EL panel 10 of the present embodiment includes a first substrate 11, a second substrate 12, an organic EL element 13, and a sealing layer 14. One surface of the first substrate 11 (the upper surface in FIG. 1B) is a mounting surface on which the organic EL element 13 is disposed. The first substrate 11 and the second substrate 12 are laminated in such a manner that the mounting surface of the first substrate 11 and one surface of the second substrate 12 (the lower surface in FIG. 1B)

face each other with the sealing layer 14 interposed therebetween. The sealing layer 14 seals a gap between the first substrate 11 and the second substrate 12 along an entire periphery of a region where the first substrate 11 and the second substrate 12 face each other. The first substrate 11 has a light incident section 15 on which laser light is incident and a light guide section 16 that directs the incident laser light in an in-plane direction. The organic EL panel 10 of the present embodiment is configured so as to include one light incident section 15 and one light guide section 16. The details of the light incident section 15 and the light guide section 16 are described below. While the organic EL panel 10 shown in FIGS. 1A and 1B is substantially rectangular, the shape of the organic EL panel of the present invention is not limited thereto. For example, the shape of the organic EL panel of the present invention may be a substantially polygonal shape other than the substantially rectangular shape, such as a substantially parallelogram shape (including a substantially square shape and a substantially rhombic shape) other than the substantially rectangular shape, a substantially trapezoidal shape, a substantially pentagonal shape, or a substantially hexagonal shape.

The material of the first substrate 11 is not limited as long as it has a light-transmitting property sufficient to allow light emitted from the organic EL element 13 and laser light to be radiated to the outside of the organic EL panel 10. Examples of the material of the first substrate 11 include: glass such as alkali-free glass, soda-lime glass, borosilicate glass, aluminosilicate glass, and quartz glass; and polyester resins such as polyethylene naphthalate and polyethylene terephthalate. Preferably, the first substrate 11 is formed of glass. The size (the length and the width) of the first substrate 11 is not particularly limited, and can be set as appropriate depending on a desired size of the organic EL panel 10, for example. The thickness of the first substrate 11 also is not particularly limited, and can be set as appropriate depending on the material of the first substrate 11, environment in which the first substrate 11 is used, and the like. Generally, the thickness of the first substrate 11 is 1 mm or less.

The position at which the light incident section 15 is disposed is not particularly limited. Preferably, as shown in FIG. 1A, the light incident section 15 is disposed at a corner of the side surface of the first substrate 11 (the lower right corner in FIG. 1A). The light incident section 15 may have any mechanism as long as it allows laser light to be incident on the first substrate 11 from the outside of the panel 10. Preferably, as shown in FIG. 1B, the light incident section 15 is a Brewster window (a plane inclined at a Brewster's angle). The Brewster's angle is an angle of incidence at which the reflectance of p-polarized light incident on an interface between two substances with different refractive indices is 0 (zero), and is represented by Equation (1). In Equation (1), $n_1$ indicates the refractive index of a substance on the light incident side, and $n_2$ indicates the refractive index of a substance on the light transmission side. For example, when light in the air with a refractive index of 1 is incident on glass with a refractive index of 1.5, the Brewster's angle $\theta_B$ is about 56°. When the light incident section 15 is the Brewster window, the loss due to the surface reflection is reduced, whereby the incident efficiency of the laser light on the first substrate 11 is improved. The size of the Brewster window is not particularly limited. Since laser light emitted outside the panel 10 can be converged by an optical system before it is incident on the Brewster window, the size of the Brewster window may be at least a few tenths of millimeters in lengthwise and crosswise, for example.

$$\text{Brewster's angle } \theta_B = \arctan(n_2/n_1) \quad (1)$$

The light guide section 16 may be disposed at any position in the first substrate 11, as long as it can direct the laser light incident on the first substrate 11 in an in-plane direction. In the organic EL panel 10 of the present embodiment, it is preferable that, as shown in FIG. 1A, the light incident section 15 causes the incident laser light to enter from the corner at which the light incident section 15 is disposed (the lower right corner in FIG. 1A) toward an adjacent corner of the side surface of the first substrate 11 (the lower left corner in FIG. 1A) and the first substrate 11 has the light guide section 16 at the adjacent corner of the side surface of the first substrate 11 (the lower left corner in FIG. 1A).

The light guide section 16 may have any mechanism as long as it can direct the laser light incident on the first substrate 11 in an in-plane direction. For example, the light guide section 16 may have a light reflecting mechanism or a light scattering mechanism. In the organic EL panel 10 shown in FIGS. 1A and 1B, the light guide section 16 is an inclined plane having a light reflecting mechanism. The light reflecting mechanism is not limited to the inclined plane, and may be any mechanism such as a reflecting mirror, for example. The light scattering mechanism may be any mechanism, such as a roughened surface of the first substrate 11, for example. The light guide section 16 may have the light reflecting mechanism only, the light scattering mechanism only, or may have both the light reflecting mechanism and the light scattering mechanism.

As the organic EL element 13, a conventionally known and commonly used organic EL element may be used. The organic EL element 13, which includes an organic EL layer and a pair of electrodes, is a laminate in which an electrode layer as one of the pair of electrodes, the organic EL layer, and another electrode layer as the other one of the pair of electrodes are laminated in this order, for example. The pair of electrodes is the combination of an anode layer and a cathode layer, for example. The anode layer is a transparent electrode formed of indium tin oxide (ITO) or the like, for example. The cathode layer is a counter electrode formed of a metal or the like, for example. The organic EL layer has a multilayer structure including, in sequence, a hole injection layer, a hole transport layer, a light emission layer containing an organic EL material, an electron transport layer, and an electron injection layer, for example. The organic EL panel shown in FIGS. 1A and 1B is of bottom emission type, for example. In the organic EL panel of bottom emission type, it is preferable that, for example, the organic EL element 13 is a laminate in which the transparent electrode (anode), the organic EL layer, and the counter electrode (cathode) are laminated in this order from the first substrate 11 side. Although FIGS. 1A and 1B show an example where one organic EL element 13 is disposed in a central portion on the mounting surface of the first substrate 11, the organic EL panel 10 of the present embodiment is not limited to this example, and a plurality of (two or more) organic EL elements may be disposed on the mounting surface of the first substrate 11. The emission color of the organic EL element 13 is not particularly limited. For example, when the organic EL panel 10 is used as a general interior lighting device, the emission color of the organic EL element 13 may be white or the like. When the organic EL panel 10 is used as a design-oriented lighting device or an automobile lighting device, the emission color of the organic EL element 13 may be white, red (R), or the like.

The second substrate 12 is a sealing substrate for shielding the organic EL element 13 from the surrounding atmosphere. The second substrate 12 is not limited as long as it can shield the organic EL element 13 from the surrounding atmosphere. For example, sealing glass can be used as the second substrate 12. The size (length and width) of the second substrate 12 is not particularly limited, and may be adjusted as appropriate so as to be substantially the same as or slightly smaller than the size of the first substrate 11, for example. The thickness of the second substrate 12 also is not particularly limited. For example, the thickness of the second substrate 12 is in the range from 0.5 to 1 mm.

The sealing layer 14 is formed by, for example, applying an adhesive along the outer edge of one surface of the second substrate 12 (the lower surface in FIG. 1B). The adhesive is not particularly limited. For example, an ultraviolet (UV) curable resin or the like can be used suitably as the adhesive. The sealing layer 14 is formed so as to be slightly thicker than the organic EL element 13. For example, the thickness thereof is in the range from 0.1 to 100 µm.

Figure 2A:
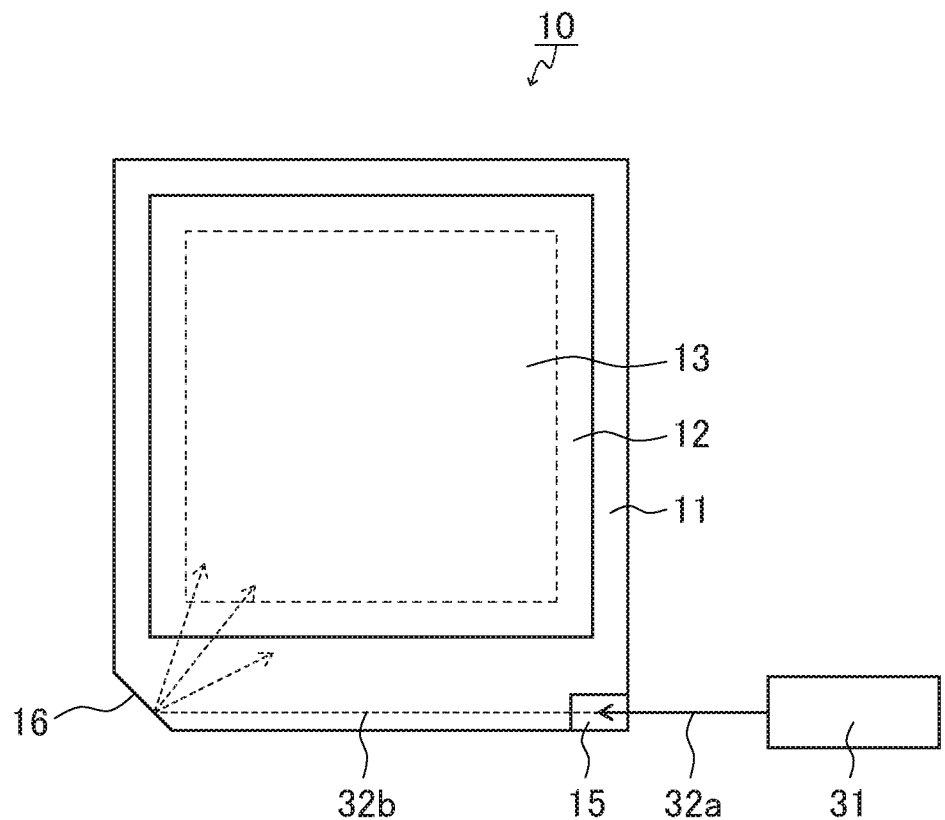
FIGS. 2A and 2B illustrate the movement of light in the organic EL panel shown in FIGS. 1A and 1B.
Figure 2B:
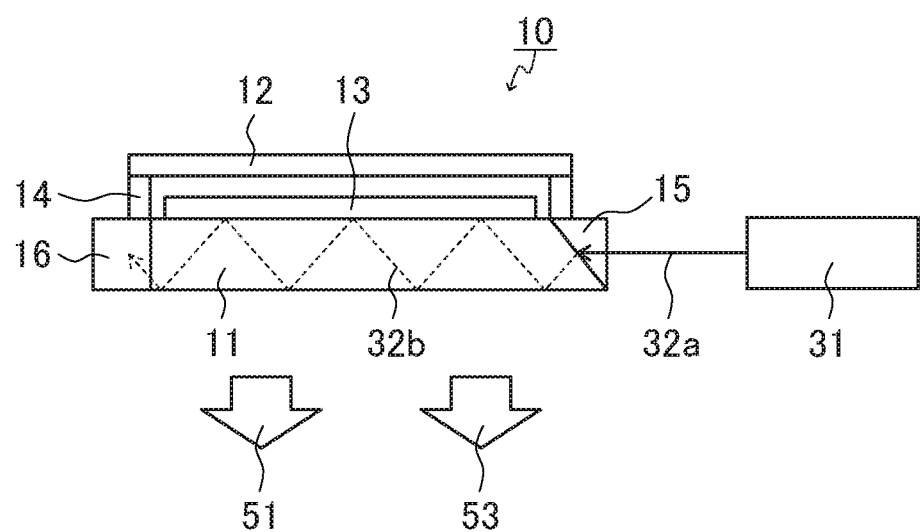

Next, with reference to FIGS. 2A and 2B, the movement of light in the organic EL panel shown in FIGS. 1A and 1B will be described. As shown in FIGS. 2A and 2B, the organic EL panel 10 of the present embodiment is used with a laser 31 disposed near the light incident section 15. The laser 31 emits light having a color different from the color of light emitted from the organic EL element 13. The emission color of the laser 31 is not particularly limited as long as it is different from the emission color of the organic EL element 13, and may be any color such as red (R), green (G), or blue (B), for example.

As indicated with a solid-line arrow 32a in FIGS. 2A and 2B, light emitted from the laser 31 travels in the air toward the light incident section 15. Then, as indicated with a dashed-line arrow 32b in FIG. 2B, the laser light that has reached the light incident section 15 travels toward the light guide section 16 while being reflected repeatedly from the lower surface and the upper surface of the first substrate 11. Then, as shown in FIG. 2A, the laser light is directed in an in-plane direction by being reflected from the light guide section 16. Subsequently, as indicated with a thick arrow 51 in FIG. 2B, the laser light directed in the in-plane direction is radiated in the air outside the organic EL panel 10 from the other surface of the first substrate 11 (the lower surface in FIG. 2B). At this time, emitted light 53 from the organic EL element 13 is mixed with the laser light 51, whereby color tuning is achieved. The laser light 32b traveling inside the first substrate 11 is intended to be radiated in the air outside the organic EL panel 10 from the first substrate 11 in the end. Thus, the first substrate 11 preferably is configured so that a side surface, a corner, or the like facing the light guide section 16 has a light scattering mechanism, such as a roughened surface of the first substrate 11.

According to the organic EL panel 10 of the present embodiment, it becomes possible for a user to adjust the emission color (to perform color tuning) of the organic EL panel 10 by selecting the laser 31 with emission color necessary for the color tuning, for example. Furthermore, according to the organic EL panel 10 of the present embodiment, the aperture ratio is not restricted, so that a larger amount of luminous flux is emitted from the light emission surface (the lower surface of the first substrate 11 in FIG. 2B), as compared with the organic EL panel with the above-described RGB separation structure.

The organic EL panel 10 of the present embodiment can be used in a wide range of applications, such as a lighting device of bottom emission type, a light source, and a display device, for example.

[Second Embodiment]

Figure 3:
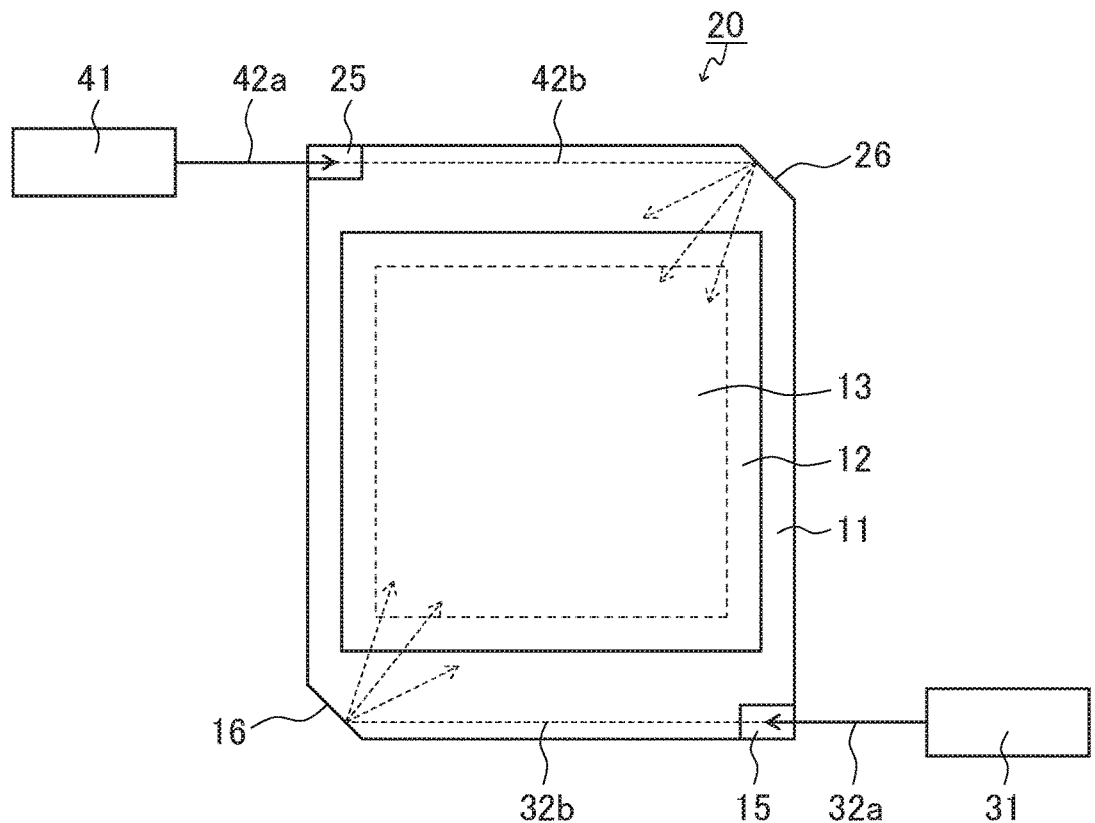
FIG. 3 is a plan view showing an example of the configuration of an organic EL panel according to a second embodiment.

The present embodiment is directed to an example of an organic EL panel configured so that a first substrate includes two light incident sections and two light guide sections. FIG. 3 is a plan view showing an example of the configuration of an organic EL panel of the present embodiment. As shown in FIG. 3, an organic EL panel 20 of the present embodiment has the same configuration as the organic EL panel 10 of the first embodiment, except that the first substrate 11 further includes a second light incident section 25 and a second light guide section 26 and that the organic EL panel 20 is used with, in addition to the laser 31, a second laser 41 disposed near the second light incident section 25. The second light incident section 25 has the same shape and mechanism as the light incident section 15, and the second light guide section 26 has the same shape and mechanism as the light guide section 16. The second light incident section 25 is disposed at a corner facing the light incident section 15, and the second light guide section 26 is disposed at a corner facing the light guide section 16. It is to be noted, however, that the organic EL panel 20 of the present embodiment is not limited to this example, and the positions of the second light incident section 25 and the second light guide section 26 are interchangeable. The second laser 41 has the same configuration as the laser 31, except that it emits light having a color different from the colors of lights emitted from the organic EL element 13 and the laser 31.

As indicated with a solid-line arrow 42a in FIG. 3, light emitted from the second laser 41 travels in the air toward the second light incident section 25. Then, as indicated with a dashed-line arrow 42b in FIG. 3, the laser light that has reached the second light incident section 25 travels toward the second light guide section 26 and is directed in an in-plane direction by being reflected from the second light guide section 26. The laser light directed in the in-plane direction is radiated in the air outside the organic EL panel 20 from the other surface of the first substrate 11. Thus, according to the organic EL panel 20 of the present embodiment, it is possible to mix three emission colors, namely, the emission color of the organic EL element 13, the emission color of the laser 31, and the emission color of the second laser 41.

When the organic EL panel of the present invention is formed in a substantially hexagonal shape, a substantially octagonal shape, or the like, for example, it becomes possible to mix three or more colors with the emission color of the organic EL element by providing three or more light incident sections and light guide sections on the first substrate and using the organic EL panel with three or more lasers.

[Third Embodiment]

Figure 4:
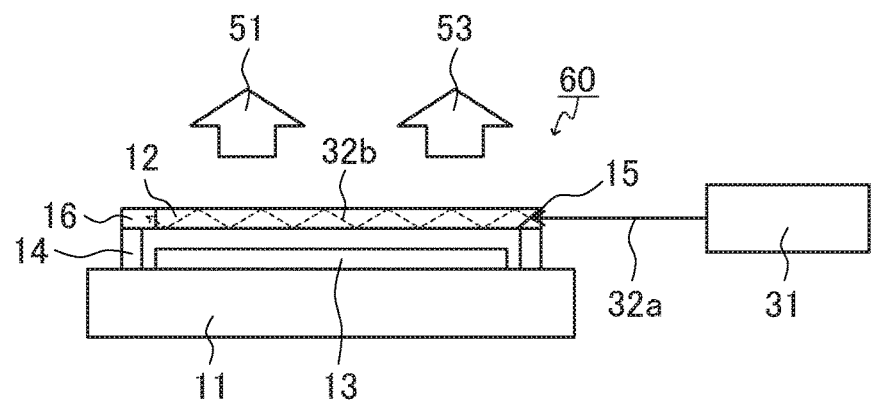
FIG. 4 is a side view showing an example of the configuration of an organic EL panel according to a third embodiment.

The present embodiment is directed to an example of an organic EL panel configured so that a second substrate includes one light incident section and one light guide section. FIG. 4 shows an example of the configuration of an organic EL panel of the present embodiment. FIG. 4 is a side view of an organic EL panel 60 of the present embodiment, as viewed from the side of a side surface connecting a light incident section and a light guide section. As shown in FIG. 4, the organic EL panel 60 of the present embodiment has the same configuration as the organic EL panel 10 of the first embodiment, except that, instead of the first substrate 11, the second substrate 12 includes the light incident section 15 and the light guide section 16. The organic EL panel shown in FIG. 4 is of top emission type, for example. In the organic EL panel of top emission type, it is preferable that, for example, the organic EL element 13 is a laminate in which the counter electrode (cathode), the organic EL layer, and the transparent electrode (anode) are laminated in this order from the first substrate 11 side. According to the organic EL panel 60 of the present embodiment, laser light 51 and emitted light 53 from the organic EL element 13 can be radiated from the upper side of the panel 60. The organic EL panel 60 of the present embodiment can be used in a wide range of applications, such as a lighting device of top emission type, a light source, and a display device, for example.

Also in the organic EL panel of the present embodiment, it is possible to mix two or more colors with the emission color of the organic EL element by providing two or more light incident sections and light guide sections on the second substrate in the same manner as they are provided on the first substrate in the second embodiment and using the organic EL panel with two or more lasers.

The first to third embodiments are directed to illustrative examples where the organic EL panel is configured so that either of the first substrate and the second substrate has the light incident section(s) and the light guide section(s). It should be noted, however, that the organic EL panel of the present invention may be configured so that both the first substrate and the second substrate has the light incident section(s) and the light guide section(s).

While the present invention has been described above with reference to exemplary embodiments, the present invention is by no means limited thereto. Various changes and modifications that may become apparent to those skilled in the art may be made in the configuration and specifics of the present invention without departing from the scope of the present invention.

This application claims priority from Japanese Patent Application No. 2015-105785 filed on May 25, 2015. The entire disclosure of this Japanese patent application is incorporated herein by reference.

INDUSTRIAL APPLICABILITY

The present invention can provide a novel organic EL panel adapted to be color tunable by a user, for example. The organic EL panel of the present invention can be used in a wide range of applications, such as a lighting device of bottom emission type, top emission type, or the like, a light source, and a display device, for example.

EXPLANATION OF REFERENCE NUMERALS 10, 20, 60: organic EL panel
11: first substrate
12: second substrate
13: organic EL element
14: sealing layer
15, 25: light incident section
16, 26: light guide section
31, 41: laser
32a, 32b, 42a, 42b, 51: laser light
53: emitted light from organic EL

The invention claimed is:
1. An organic EL panel comprising:
a first substrate;
a second substrate;
at least one organic EL element; and
a sealing layer,
wherein one surface of the first substrate is a mounting surface on which the at least one organic EL element is disposed,
the first substrate and the second substrate are laminated in such a manner that the mounting surface of the first substrate and one surface of the second substrate face each other with the sealing layer interposed therebetween,
the sealing layer seals a gap between the first substrate and the second substrate along an entire periphery of a region where the first substrate and the second substrate face each other, and
at least one of the first substrate and the second substrate comprises at least one light incident section on which laser light is incident and at least one light guide section that directs the incident laser light in an in-plane direction.

2. The organic EL panel according to claim 1, wherein the light incident section has a Brewster's angle.

3. The organic EL panel according to claim 1, wherein the light guide section has at least one of a light reflecting mechanism and a light scattering mechanism.

4. The organic EL panel according to claim 1, wherein at least one of the first substrate and the second substrate has the light incident section at a corner of a side surface thereof.

5. The organic EL panel according to claim 4, wherein the light incident section causes the incident laser light to travel from the corner at which the light incident section is disposed toward at least one adjacent corner on the side surface of the at least one of the first substrate and the second substrate.

6. The organic EL panel according to claim 5, wherein at least one of the first substrate and the second substrate has the light guide section at least one adjacent corner on the side surface of the at least one of the first substrate and the second substrate.

7. The organic EL panel according to claim 1, wherein the organic EL panel comprises two or more light incident sections as the at least one light incident section and two or more light guide sections as the at least one light guide section,
the light incident sections are provided at different corners of at least one of the first substrate and the second substrate, respectively, and
the light guide sections are provided at different corners of the at least one of the first substrate and the second substrate, respectively.

8. The organic EL panel according to claim 1, wherein at least one of the first substrate and the second substrate is a glass substrate.

9. The organic EL panel according to claim 1, wherein the organic EL element comprises an organic EL layer and a pair of electrodes.

10. The organic EL panel according to claim 9, wherein the organic EL element is a laminate in which an electrode layer as one of the pair of electrodes, the organic EL layer, and another electrode layer as the other one of the pair of electrodes are laminated in this order and the electrode layer on the first substrate side is a transparent electrode, and
the first substrate has the light incident section and the light guide section.

11. The organic EL panel according to claim 9, wherein the organic EL element is a laminate in which an electrode layer as one of the pair of electrodes, the organic EL layer, and another electrode layer as the other one of the pair of electrodes are laminated in this order and the electrode layer on the second substrate side is a transparent electrode, and the second substrate has the light incident section and the light guide section.

* * * * *